United States Patent [19]

Ferro et al.

[11] 4,099,998
[45] Jul. 11, 1978

[54] METHOD OF MAKING ZENER DIODES WITH SELECTIVELY VARIABLE BREAKDOWN VOLTAGES

[75] Inventors: Armand P. Ferro, Schenectady, N.Y.; Bruno F. Kurz, deceased, late of Schenectady, N.Y., by Elizabeth Kurz-Beerli, also known as Elizabeth Kurz Chinoy, executrix

[73] Assignee: General Electric Company, Schenectady, N.Y.

[21] Appl. No.: 716,090

[22] Filed: Aug. 20, 1976

Related U.S. Application Data

[62] Division of Ser. No. 628,376, Nov. 3, 1975.

[51] Int. Cl.² ............... H01L 21/22; H01L 21/66
[52] U.S. Cl. ................... 148/187; 29/574; 29/578; 148/175; 148/190; 357/13; 357/20; 357/90
[58] Field of Search ............ 148/175, 187, 190; 357/13, 20, 90; 29/574, 578

[56] References Cited

U.S. PATENT DOCUMENTS

| | | | |
|---|---|---|---|
| 3,378,915 | 4/1968 | Zenner | 357/13 X |
| 3,456,168 | 7/1969 | Tatom | 357/20 X |
| 3,490,962 | 1/1970 | Duffy et al. | 148/187 |
| 3,602,778 | 8/1971 | Ura et al. | 357/13 |
| 3,667,009 | 5/1972 | Rugg | 357/13 X |
| 3,677,838 | 7/1972 | De Brebisson | 148/187 |
| 3,717,516 | 2/1973 | Hatcher et al. | 148/187 |
| 3,765,961 | 10/1973 | Mar | 148/175 |

OTHER PUBLICATIONS

Sze, S. M., "Physics of Semiconductor Devices" Textbook, Wiley-Interscience, 1969, pp. 111–126.
Sze et al., "Avalanche Breakdown Voltages . . . Ge, Si, GaAr, and GaP", Applied Physics Letters, vol. 8, No. 5, Mar. 1, 1966, pp. 111–113.

*Primary Examiner*—R. Dean
*Assistant Examiner*—W. G. Saba
*Attorney, Agent, or Firm*—Marvin Snyder; Joseph T. Cohen; Julius J. Zaskalicky

[57] ABSTRACT

Zener diodes of selectively variable breakdown voltages ranging from a few voltages to several hundred volts are fabricated in monolithic integrated circuits by locating the edge of a P-N junction at the surface of a substrate within the gradient region of P-type diffusion. Methods for making the same are also described.

4 Claims, 5 Drawing Figures

METHOD OF MAKING ZENER DIODES WITH SELECTIVELY VARIABLE BREAKDOWN VOLTAGES

This is a division of application Ser. No. 628,376, filed 11/3/75.

The present invention relates to monolithic integrated circuits including zener diodes and more particularly to zener diodes of selectively variable breakdown voltages ranging from a few volts to several hundred volts.

The reverse voltage-current characteristics of P-N junction diodes have found wide application in monolithic integrated circuits. For example, zener diodes are frequently used as voltage references in voltage regulators and operational amplifiers or function as voltage dividers or limiters in high voltage supplies. The fabrication of zener diodes in monolithic integrated circuits has been exceedingly difficult and, hence, the reverse breakdown voltage characteristic of the base-emitter junction of an N-P-N transistor, for example, are generally employed. Since the base-emitter breakdown voltage generally does not exceed 8 volts, the circuit designer has been limited in the application of such devices. In addition, since the base-emitter zener breakdown voltage is strongly dependent upon the impurity concentration of the base region of an N-P-N transistor and the base concentration of the transistor may require some variation for other parameter considerations, the resulting zener diode constructed in monolithic form is generally a compromise device with less than satisfactory performance.

U.S. Pat. No. 3,677,838 issued to de Brebisson, relates to the manufacture of zener diodes in a semiconductor body in which a P-N junction is formed between two zones of opposite conductivity type by diffusing opposite conductivity impurities into two surface adjacent portions of the semiconductor body. The lateral spreading of the diffusion causes the two zones to overlap and thereby produce a P-N junction therebetween. The de Brebisson patent describes the voltage breakdown properties of the diode as determined by the P-N junction between the two diffused adjacent regions and not by a junction between one of the diffused regions and the semiconductor body. The resulting device is stated to exhibit an abrupt junction having a breakdown voltage of a few volts and a very low noise level.

As further described by de Brebisson, where one of the diffused zones is provided simultaneously with the insulating zones while the other zone is made simultaneously with the emitter zone, the diode exhibits a breakdown voltage of approximately 5 to 6 volts. Where one of the diffused zones is made simultaneously with the base zone of a transistor and the other diffused zone simultaneously with the emitter zone of the transistor, the resultant breakdown voltage is about 6 to 8 volts.

While the zener diodes described in the above-identified patent may have utility in certain applications, they have not provided the circuit designer with a broad range of zener diode breakdown voltages useful in monolithic integrated circuits that would permit him greater freedom of circuit design. Specifically, the designer is still limited to approximately an 8 volt device and is further limited by the parameter considerations affecting other devices on the semiconductor wafer.

It is therefore an object of this invention to provide a zener diode and method of making the same which is fully compatible with monolithic integrated circuit technology while providing a full range of selectable zener breakdown voltages ranging from a few volts to several hundred volts, without adding to or altering the normal integrated circuit process sequence.

Briefly, in accordance with one of the novel aspects of the invention, it has been discovered that a wide range of zener diode breakdown voltages is achieved in a monolithic integrated circuit by locating the edge of a P-N junction at the surface of a substrate and in the gradient region of a P-type diffusion region. In accordance with one embodiment of the invention, a P-type conductivity region is formed in an N-type conductivity substrate. Intersecting the P-type region is an $N^+$-type conductivity region. At the intersection of the P- and $N^+$-type regions, a P-$N^+$ junction is formed which is characterized by a breakdown voltage that varies with the location of the edge of the P-$N^+$ junction at the surface of the substrate relative to the impurity concentration of the P-type region at the surface.

In its simplest form, the invention is based on the understanding that the breakdown voltage of a P-N junction varies with the location of the edge of the P-N junction at the surface of the substrate relative to the impurity concentration in the gradient region (i.e., the region of decreasing impurity concentration) of the region of lower impurity concentration.

In further accord with the invention, zener diodes of selectable breakdown voltage are easily constructed by selecting the location of the edge of an $N^+$ region along the surface of the gradient portion of a P-type region. It has been found that the voltage breakdown $V_B$ of such P-N junctions are of the linearly graded type, as distinguished from the abrupt junction type and further that the voltage breakdown $V_B$ is approximately equal to $$V_B \simeq 60 \, (E_g/1.1)^{6/5} (a/3 \times 10^{20})^{-2/5} \text{ volts}$$

where $E_g$ is the energy bandgap in electron volts and
$a$ is the impurity gradient in cm$^{-4}$.

Where the diffusion profile is defined by a Gaussian function, for example, the impurity gradient can be approximated by the following equation:

$$a = \frac{N_A(x_1)}{x_{jE}} \cdot \ln \frac{N_{D\,max}}{N_A(x_1)}$$

where $N_A$ is the impurity concentration of a P-type diffusion region, for example, at a distance $x_1$ from the surface concentration, $N_{D\,max}$ is the maximum surface donor concentration of an $N^+$ diffusion region and $x_{jE}$ is the junction depth of the $N^+$ diffusion.

The invention is described more fully below with reference to the drawings wherein.

Figure 1:
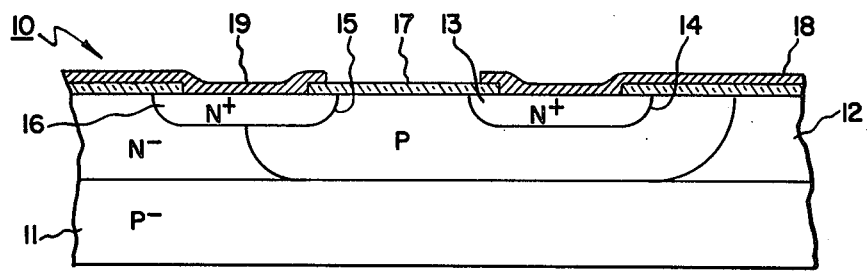
FIG. 1 is a cross-sectional view of a semiconductor substrate including two zener diodes constructed in accordance with the prior art.

FIG. 1 illustrates a portion of a semiconductor substrate 10 including a region of P⁻-type conductivity, for example, with an N⁻-type conductivity region 12 formed thereover, by an epitaxy process, for example. In accordance with prior art techniques for making zener diodes, FIG. 1 also illustrates an N⁺-type conductivity region 13 formed completely within the P-type conductivity region 12 where the surface impurity concentration is substantially constant. The intersection of the N⁺- and P-type conductivity regions 12 and 13 forms a P-N⁺ junction 14 which intersects the surface of the P-type conductivity region 12 where the impurity concentration of the P-type conductivity region 12 is substantially constant.

FIG. 1 illustrates a second P-N junction 15 which is formed at the intersection of an N⁺-type conductivity region 16 with the P-type conductivity region 12. The P-N⁺ junction 15 also intersects the surface of the P-type conductivity region 12 where the surface impurity concentration is substantially constant and at its highest value.

An insulating layer 17, such as silicon dioxide, overlies the surface of the semiconductor substrate 10 and includes at least two apertures through which electrical contact is made to the underlying regions 13 and 16 by electrodes 18 and 19, respectively.

The breakdown voltages of the prior art zener diodes illustrated in FIG. 1 are determined by the junctions 14 and 15 formed between the regions 12 and 13 and 12 and 16, respectively. As described earlier, the breakdown voltage of these prior art zener diodes is on the order of 5 to 8 volts.

Figure 2:
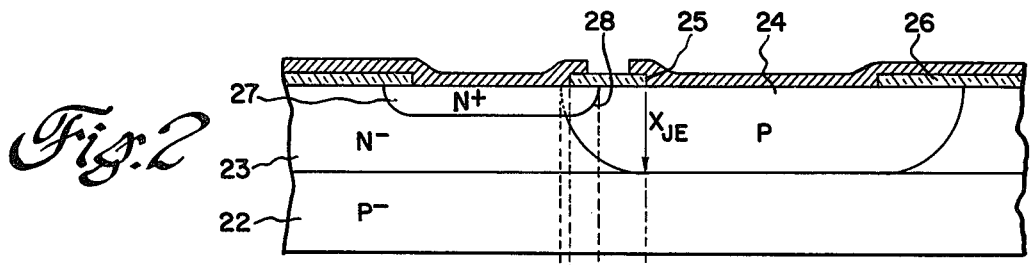
FIG. 2 is a cross-sectional view of a semiconductor substrate illustrating a zener diode constructed in accordance with one embodiment of the present invention.

In contradistinction to the low voltage breakdown devices available in accordance with prior art techniques for making zener diodes, the present invention provides a selectable breakdown voltage ranging from a few volts to several hundred volts. FIG. 2 illustrates more clearly how the selectively variable breakdown voltage is achieved in accordance with one embodiment of the present invention. In particular, FIG. 2 illustrates a substrate 22 of P-type conductivity, for example, with an N-type conductivity region 23 in contact therewith, preferably formed by an epitaxial process. Within the N-type region 23, a P-type region 24 is formed by diffusion through an aperture 25 in a mask 26 overlying the surface of the N-type region 23. Immediately adjacent the P-type region 24 and intersecting the same is an N⁺-type region 27 also formed by diffusion, for example, through an aperture in the mask 26. As will become more apparent from the description below, the N⁺-type conductivity region 27 is made to intersect the P-type region 24 and form a PN junction 28 which intersects the surface of the semiconductor substrate at a location $x_1$. The location $x_1$ along the surface of the substrate is measured from a location $x_o$, the location defining the edge of the aperture 25 in the mask 26. The radius of curvature $x_{jE}$ defines the depth of diffusion of the P-type region and the maximum extent of allowable lateral diffusion along the surface of the substrate beneath the mask 26 under normal conditions.

Figure 3:
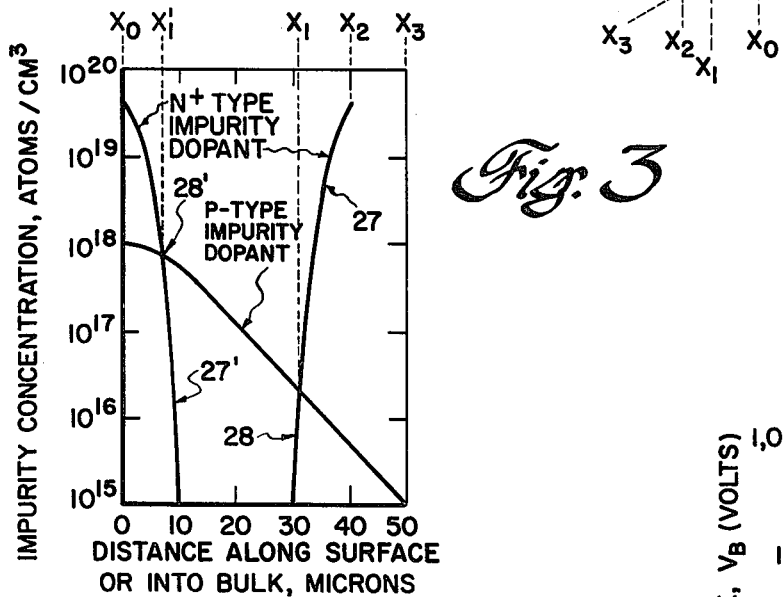
FIG. 3 is a plot of the impurity concentration as a function of distance into the semiconductor bulk or laterally along the surface of the semiconductor substrate.

Between the locations $x_o$ and $x_3$ along the surface of the substrate, the impurity concentration of the P-type region 24 varies from a maximum at the surface (within the region of the aperture 25) to a minimum at the location $x_3$. FIG. 3 illustrates graphically this variation in impurity concentration where the P-type impurity dopant produces an impurity concentration at the surface location $x_o$ of approximately $10^{18}$ atoms/cm³ and decreases to a concentration of approximately $10^{15}$ atoms/cm³ at a location 50 microns therefrom. FIG. 3 also illustrates the variation in impurity concentration for the N⁺-type region 27 as having a surface impurity concentration of approximately $5 \times 10^{19}$ atoms/cm³ decreasing to approximately $10^{15}$ atoms/cm³ at a distance of 10 microns from the surface.

FIG. 3 also illustrates the formation of the junction 28 at the intersection of the N⁺-type region 27 and the P-type region 24 at a distance $x_1$ of approximately 7 microns from $x_2$ where the surface impurity concentration of the P-type region is approximately $1.2 \times 10^{16}$ atoms/cm⁴. As the intersection of the junction 28 moves laterally along the surface from a point $x_2$ to $x_o$, the impurity concentration of the P-type region 24 increases and the breakdown voltage of the P-N junction 28 decreases. The specific relationship between the breakdown voltage $V_B$ and the impurity gradient is set forth in the equation given above. For zener diodes constructed in silicon semiconductor material, for example, where the energy bandgap is approximately 1.1eV, the above equation can be simplified to:

$$V_B \simeq 60 \, (a/3 \times 10^{20})^{-2/5}$$

where $a$ is the impurity gradient as defined above. By utilizing the information given above, i.e., $N_{D\,max} = 5 \times 10^{19}$ atoms/cm⁴, $N_A(x_1) = 1.2 \times 10^{16}$ atoms/cm³ at $x_{jE} = 7$ microns, $a = 1.43 \times 10^{20}$ atoms/cm⁴ and hence $V_B \simeq 81$ volts.

By way of further example, assume the N⁺-type region 27 has an impurity concentration profile which intersects the P-type region 24 at a distance $x_1$ of 20 microns from $x_2$. At this distance $x_1$, the impurity concentration $N_A(x_1)$ of the acceptor doped P-type region 24 is $1.0 \times 10^{17}$ atoms/cm³, as determined from FIG. 3. Again, using the above equation, $a = 3.1 \times 10^{20}$ atoms/cm⁴ and $V_B \simeq 59$ volts.

Figure 5:
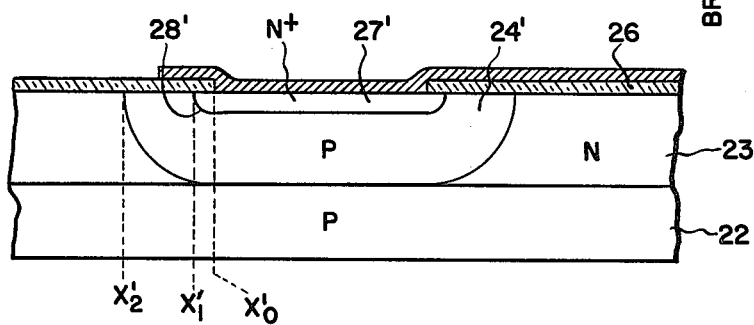
FIG. 5 is a cross-sectional view of a semiconductor substrate illustrating another embodiment of the invention.

FIG. 5 illustrates yet another embodiment of the invention wherein an N⁺-type region 27' is formed completely within a P-type region 24'. However, in contradistinction to the prior art techniques for producing a voltage breakdown device limited to approximately 8 volts, selectively variable breakdown voltages up to several hundred volts are also achieved in accordance with this embodiment of the invention. As illustrated in FIG. 5, a P-N junction 28' is formed between the N⁺-type region 27' and the P-type region 24' in the gradient region thereof. In this embodiment of the invention, the voltage breakdown characteristics of the device are also characterized by a linearly graded junction, but of a different slope (as illustrated in FIG. 3) from that of the first embodiment of the invention. The equations given above for calculating the voltage breakdown as a function of distance along the surface of the semiconductor are also applicable to this second embodiment. It should be noted that this embodiment requires that the junction 28' be located everywhere around the N⁺ 27' region at the same point. If parts of the N⁺ region junction were located at values of surface concentration of region 24' higher than at $x_1'$, the resultant lower breakdown voltage would dominate. Those skilled in the art can appreciate that this embodiment is more amenable to high power zener diodes where substantial currents are required.
that this embodiment is more amenable to high power zener diodes where substantial currents are required.

Table I illustrates, by way of still further example, the variation in breakdown voltage $V_B$ as a function of the location of the P-N junction 28' within the gradient region of the P-type region 24'.

TABLE I

| $N_{Dmax}$ atoms/cm$^3$ | $N_A(x_1)$ atoms/cm$^3$ | $x_{jE}$ microns | a atoms/cm$^4$ | $V_B$ volts |
|---|---|---|---|---|
| 5 × 10$^{19}$ | 8 × 10$^{17}$ | 3.5 | 4.17 × 10$^{22}$ | 8.3 |
| 5 × 10$^{19}$ | 7 × 10$^{17}$ | 7.0 | 4.27 × 10$^{21}$ | 21 |
| 5 × 10$^{19}$ | 5 × 10$^{17}$ | 10.0 | 2.3 × 10$^{21}$ | 27 |
| 5 × 10$^{19}$ | 3 × 10$^{17}$ | 15.0 | 1.7 × 10$^{21}$ | 30 |
| 5 × 10$^{19}$ | 1.75 × 10$^{17}$ | 20.0 | 4.9 × 10$^{20}$ | 49 |
| 5 × 10$^{19}$ | 8 × 10$^{16}$ | 25.0 | 2.06 × 10$^{20}$ | 70 |
| 5 × 10$^{19}$ | 3.5 × 10$^{16}$ | 30 | 8.49 × 10$^{19}$ | 99 |
| 5 × 10$^{19}$ | 1 × 10$^{16}$ | 35 | 2.42 × 10$^{19}$ | 164 |
| 5 × 10$^{19}$ | 4 × 10$^{15}$ | 40 | 9.43 × 10$^{18}$ | 239 |

Figure 4:
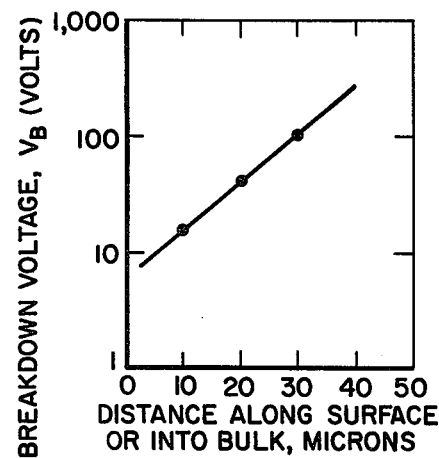
FIG. 4 is a plot of the variation in zener breakdown voltage as a function of distance along the semiconductor surface.

FIG. 4 is a semi-logarithmic plot of the variation in breakdown voltage as a function of the distance along the semiconductor surface where the impurity concentration of the P-type region varies from a maximum to a minimum. As can be readily appreciated by those skilled in the art, the voltage breakdown varies from less than approximately 10 volts to over 200 volts for the embodiment of the invention illustrated in FIG. 5 as defined by the impurity concentrations illustrated in FIG. 3. Obviously, other impurity concentrations and profiles for the P-type region and the N$^+$-type region will produce yet other breakdown voltages which are easily calculated from the equations given above.

In summary, zener diodes of selectably variable breakdown voltages ranging from a few volts to several hundred volts and methods of making the same are described. Those skilled in the art can readily appreciate that various modifications and changes can be made without departing from the spirit and scope of the present invention. For example, semiconductor materials other than silicon may be employed, if desired. Similarly, in addition to the Gaussian diffusion profile, the error diffusion profile may be utilized to determine the impurity concentration gradient. It is therefore intended that the appended claims cover all such modifications and variations.

What we claim as new and desire to secure by Letters Patent of the United States is:

1. A method of making a semiconductor device characterized by a selectively variable breakdown voltage ranging from a few volts to several hundred volts, said method comprising:

diffusing into a substrate a first impurity-doped region of a conductivity-type different from that of said substrate, said first region having a surface-adjacent portion of substantially constant impurity concentration and a gradient region of decreasing impurity concentration extending laterally from said surface-adjacent portion;

diffusing into said substrate a second region of the same conductivity type as said substrate but of higher impurity concentration, said second region intersecting a surface-adjacent portion of said gradient region to form a P-N junction at the intersection of the edge of said second region with said gradient region; and selecting the location of the intersection between the edge of said second region and the surface-adjacent portion of said gradient region to provide a specific breakdown voltage, $V_B$, which varies with the location of the P-N junction at the surface of the substrate relative to the impurity concentration in the gradient region in accord with the following equation for linearly graded junctions:

$$V_B \simeq 60(E_g/1.1)^{6/5}(a/3 \times 10^{20})^{-2/5} \text{ volts},$$

where
$E_g$ is the energy bandgap in electron volts and
$a$ is the impurity gradient in cm$^{-4}$.

2. The method of claim 1 wherein the impurity gradient $a$ is defined by the following equation:

$$a \simeq \frac{N_A(x_1)}{x_{jE}} \cdot \ln \frac{N_{D\,max}}{N_A(x_1)}$$

where
$N_A(x_1)$ is the impurity concentration, cm$^{-4}$, of the first region at a distance $x_1$ from said surface-adjacent portion,
$N_{Dmax}$ is the maximum surface impurity concentration, cm$^{-4}$, of said second region, and
$x_{jE}$ is the P-N junction depth of said second region.

3. The method of claim 2 wherein said second region is diffused completely within said first region.

4. The method of claim 2 wherein said second region is diffused adjacent to said first region and intersects only a portion of said gradient region.

* * * * *